(12) United States Patent
Hierlemann

(10) Patent No.: US 7,851,302 B2
(45) Date of Patent: Dec. 14, 2010

(54) CAPACITORS AND METHODS OF MANUFACTURE THEREOF

(75) Inventor: Matthias Hierlemann, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 870 days.

(21) Appl. No.: 11/051,363

(22) Filed: Feb. 4, 2005

(65) Prior Publication Data
US 2006/0177981 A1    Aug. 10, 2006

(51) Int. Cl.
*H01L 21/8242* (2006.01)

(52) U.S. Cl. .................. 438/253; 438/239; 438/261; 438/393; 438/396

(58) Field of Classification Search ........... 438/210, 438/239, 250, 253, 393, 396, 622, FOR. 220, 438/FOR. 430, 261; 257/306, 532, 758, 257/E21.582, E27.088
See application file for complete search history.

(56) References Cited

U.S. PATENT DOCUMENTS

| | | | | |
|---|---|---|---|---|
| 5,077,762 A | * | 12/1991 | Morimoto et al. | 377/57 |
| 6,144,051 A | * | 11/2000 | Nishimura et al. | 257/277 |
| 6,159,793 A | * | 12/2000 | Lou | 438/255 |
| 6,620,701 B2 | | 9/2003 | Ning | |
| 6,677,635 B2 | | 1/2004 | Ning et al. | |
| 6,706,588 B1 | | 3/2004 | Ning | |
| 6,723,600 B2 | | 4/2004 | Wong et al. | |
| 6,794,262 B2 | | 9/2004 | Ning et al. | |
| 2003/0143322 A1 | | 7/2003 | Ning | |
| 2005/0121744 A1 | * | 6/2005 | Chang et al. | 257/532 |
| 2006/0017115 A1 | * | 1/2006 | Tu et al. | 257/371 |

* cited by examiner

*Primary Examiner*—N Drew Richards
*Assistant Examiner*—Joannie A Garcia
(74) *Attorney, Agent, or Firm*—Slater & Matsil, L.L.P.

(57) ABSTRACT

Capacitors are formed in metallization layers of semiconductor device in regions where functional conductive features are not formed, more efficiently using real estate of integrated circuits. The capacitors may be stacked and connected in parallel to provide increased capacitance, or arranged in arrays. The plates of the capacitors are substantially the same dimensions as conductive features, such as conductive lines or vias, or are substantially the same dimensions as fill structures of the semiconductor device.

20 Claims, 6 Drawing Sheets

CAPACITORS AND METHODS OF MANUFACTURE THEREOF

TECHNICAL FIELD

The present invention relates generally to the design and manufacture of semiconductor devices, and more particularly to the formation of capacitors in integrated circuits.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example. Semiconductor devices are manufactured by depositing many different types of material layers over a semiconductor workpiece or wafer, and patterning the various material layers using lithography. There may be a plurality of transistors, memory devices, switches, conductive lines, diodes, capacitors, logic circuits, and other electronic components formed on a single die or chip.

Capacitors are elements that are used extensively in semiconductor devices for storing an electrical charge. Capacitors essentially comprise two conductive plates separated by an insulator. The capacitance, or amount of charge held by the capacitor per applied voltage, depends on a number of parameters such as the area of the plates, the distance between the plates, and the dielectric constant value of the insulator between the plates, as examples. Capacitors are used in filters, analog-to-digital converters, memory devices, control applications, and many other types of semiconductor devices.

The material layers of semiconductor devices typically comprise thin films of conductive, semiconductive, and insulating materials that are patterned and etched to form integrated circuits (IC's). Each material layer is patterned with a desired pattern, e.g., using a photoresist and/or hard mask as a mask while exposed portions of the material layer are etched away, using dry or wet etch processes, as examples.

The manufacturing of semiconductor devices is typically classified into two phases, the front end of line (FEOL) and the back end of line (BEOL). The BEOL is typically considered to be the point of the manufacturing process where metallization layers are formed, and the FEOL is considered to include the manufacturing processes prior to the formation of metallization layers.

Metallization layers are usually the top-most layers of semiconductor devices. While some integrated circuits have a single top layer of metallization, other integrated circuits comprise multi-level interconnects, as shown in FIG. 1, wherein two or more metallization layers M1, V1, M2, V2, and M3 are formed over a workpiece 102. The metallization layers M1, V1, M2, V2, and M3 include conductive line layers M1, M2, and M3, and via layers V1 and V2. While only five metallization layers M1, V1, M2, V2, and M3 are shown in FIG. 1, in some integrated circuit designs, there may be 8, 10, or even 12 or more conductive line layers M1, M2, M3, . . . $M_x$ separated by via layers V1, V2, . . . $V_y$, for example.

Each conductive line layer M1, M2, and M3 typically comprises a plurality of conductive lines 106a, 106b, 106c separated from one another by an insulating material 104a, 104c, 104d, also referred to as an inter-level dielectric (ILD). The conductive lines 106a, 106b, and 106c in adjacent horizontal metallization layers M1, M2, and M3 may be connected vertically in predetermined places by vias 108a and 108b formed between the conductive lines 106a, 106b, and 106c, as shown.

The bottom conductive line layer M1 comprising conductive lines 106a makes electrical contact to components formed in and/or on the workpiece 102 in active areas of the semiconductor device 100 in region 112. The top conductive line layer M3 (or layer $M_x$, not shown in FIG. 1, if there are additional metallization layers, for example) may be used to make electrical connection to another die or to leads of a package, for example, and thus, the top layer of conductive lines, e.g., conductive lines 106c in conductive line layer M3, are typically larger than conductive lines 106a and 106b in the lower conductive line layers M1 and M2, as shown.

Metallization layers M1, V1, M2, V2, and M3 may be formed using subtractive etch processes or by damascene etch processes. In a subtractive etch process, a conductive material is deposited over a wafer, and the conductive material is patterned into the desired conductive feature pattern, such as conductive lines 106a, 106b, and 106c or vias 108a and 108b. A dielectric material is then deposited between the conductive features. In a damascene process, a dielectric material is deposited over a wafer, and then the dielectric material is patterned with a conductive feature pattern. The conductive feature pattern typically comprises a plurality of trenches, for example. The trenches are then filled in with conductive material, and a chemical-mechanical polish (CMP) process is used to remove the excess conductive material from the top surface of the dielectric material. The conductive material remaining within the dielectric material comprises conductive features such as conductive lines 106a, 106b, and 106c and/or vias 108a and 108b.

Damascene processes are typically either single or dual damascene. In a single damascene process, one metallization layer, e.g., M1, V1, or M2 is formed at a time. For example, referring to conductive line layer M1 of FIG. 1, the insulating layer 104a is patterned and then filled with metal, and a CMP process is used to form a single metal layer comprised of conductive lines 106a. In a dual damascene process, two adjacent horizontal insulating layers are patterned, e.g., by forming two lithography patterns in two insulating layers such as layers 104b and 104c, or in a single insulating layer such as layer 104d. The two patterns are then filled with metal, and a CMP process is used to remove excess conductive material from over the insulating layer 104c or 104d, leaving patterned conductive material in the insulating layers. For example, the patterns may comprise conductive lines 106c in one insulating layer portion and vias 108b in the underlying insulating layer portion. Thus, in a dual damascene process, conductor and via trenches are filled in one fill step.

In the past, aluminum was used as a conductive line material in integrated circuits, which is easy to subtractively etch. However, as semiconductor devices are scaled down in size, there is a trend towards the use of copper for interconnect material, which is difficult to subtractively etch, and thus, damascene processes are typically used to form copper conductive features.

CMP processes are used in damascene processes and are also used for global planarization of a semiconductor wafer to remove excess material from over certain topographical features, e.g., after an etch process, for example. It is important for etch processes and CMP processes to have a uniform effect on semiconductor devices during the fabrication process in some designs, so that the various devices formed thereon have uniform electrical parameters. A planar top surface of a semiconductor device at various stages of manufacturing is also important to achieve depth of focus (DOF) for lithography processes, for example.

To ensure planarity of features across the surface of a wafer, "dummy" or non-functional conductive lines and vias are often formed in regions 114 where conductive features, e.g., conductive lines 106a, 106b, and 106c and vias 108a and 108b are not electrically required for the integrated circuit design, e.g., as shown in FIG. 1 in region 114. For example, dummy conductive lines and vias may be formed between areas of widely-spaced conductive lines and vias, to improve planarity. The dummy conductive structures 106a, 106b, 106c, 108a, and 108b are also referred to in the art as "fill structures," for example.

While dummy conductive lines 106a, 106b, and 106c and vias 108a and 108b in region 114 improve planarity of the material layers of semiconductor devices, they are an inefficient use of surface area, because they are not electrically used. In semiconductor device design, it is often desirable to efficiently utilize the surface area of each material layer, in order to achieve decreased size of the chips and improve performance of the devices, for example.

Thus, what are needed in the art are more efficient ways of utilizing space in semiconductor device material layers.

SUMMARY OF THE INVENTION

These and other problems are generally solved or circumvented, and technical advantages are generally achieved, by preferred embodiments of the present invention, which comprise novel capacitor structures that are formed in electrically unused regions of conductive material layers. To form the capacitors, a capacitor dielectric is formed between metallization layers over conductive lines or vias in regions where conductive lines or vias will not be used as interconnects.

In accordance with a preferred embodiment of the present invention, a method of manufacturing a semiconductor device includes providing a workpiece, the workpiece comprising at least one first region and at least one second region. At least one active area is formed in or over the workpiece, and at least one metallization layer is formed over the workpiece. The at least one first region of the workpiece comprises a region wherein the at least one metallization layer comprises interconnects of the semiconductor device, and the at least one second region comprises a region wherein the at least one metallization layer comprises at least one capacitor. Forming the at least one metallization layer comprises forming at least one plate of the at least one capacitor from a portion of the at least one metallization layer.

In accordance with another preferred embodiment of the present invention, a method of designing a semiconductor device includes designing an integrated circuit, the integrated circuit design comprising at least one active area, and determining a layout for at least one metallization layer over the at least one active area. The layout for the at least one metallization layer includes at least one first region and at least one second region. The at least one first region comprises a region wherein the at least one metallization layer comprises interconnects of the semiconductor device, and the at least one second region comprises a region with no interconnects disposed therein. A layout is determined for at least one capacitor in the at least one metallization layer in the at least one second region.

In accordance with yet another preferred embodiment of the present invention, a semiconductor device includes a workpiece, the workpiece comprising at least one first region and at least one second region, and at least one active area formed in or over the workpiece. At least one metallization layer is disposed over the workpiece. The at least one first region comprises a region wherein the at least one metallization layer comprises interconnects of the semiconductor device. The at least one second region comprises a region wherein the at least one metallization layer comprises at least one capacitor. The at least one capacitor in the at least one second region comprises at least one plate comprised of a portion of the at least one metallization layer.

Advantages of embodiments of the present invention include providing improved methods of utilizing space in semiconductor devices by fabricating capacitors in electrically unused areas of metallization layers. A plurality of the capacitors may be stacked and electrically coupled together in parallel to provide increased capacitance. A plurality of the capacitors may be arranged in an array and may be accessed using addressing. The capacitors may be electrically connected to functional regions of the semiconductor device, or may be used as spare capacitors. Because the capacitors comprise plates comprised of substantially the same dimensions as interconnect features and/or fill structures, the capacitors are easily integratable into existing semiconductor device structures and manufacturing process flows. The novel capacitors are small, fast, and low in complexity and cost. The capacitors may be tuned by adjusting the capacitor dielectric thickness and materials, and by array arrangement, as examples.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention include methods of manufacturing a semiconductor device having capacitors formed in metallization layers and structures thereof. In general, in some embodiments, a plurality of metallization layers are formed over a workpiece, wherein the plurality of metallization layers include a first metallization layer and at least one second metallization layer. A first region of the workpiece comprises a region where the plurality of metallization layers comprise interconnects of the semiconductor device. A second region of the workpiece comprises a region where the capacitors of the present invention are formed. A first plate of the capacitor is comprised of a portion of the first metallization layer. A second plate of the capacitor is comprised of a portion of the at least one second metallization layer. The capacitor includes a capacitor dielectric disposed between the first plate and the second plate. Several preferred methods of forming the capacitors will be described herein.

FIGS. 2 through 5 show cross-sectional views of a method of manufacturing a capacitor of a semiconductor device 200 at various stages of manufacturing in accordance with an embodiment of the present invention. Like numerals are used as reference numbers for the various elements shown as were used in the prior art drawing of FIG. 1. In this embodiment, a capacitor 218 (see FIG. 5) is formed by a subtractive etch process or by single damascene processes.

Figure 2:
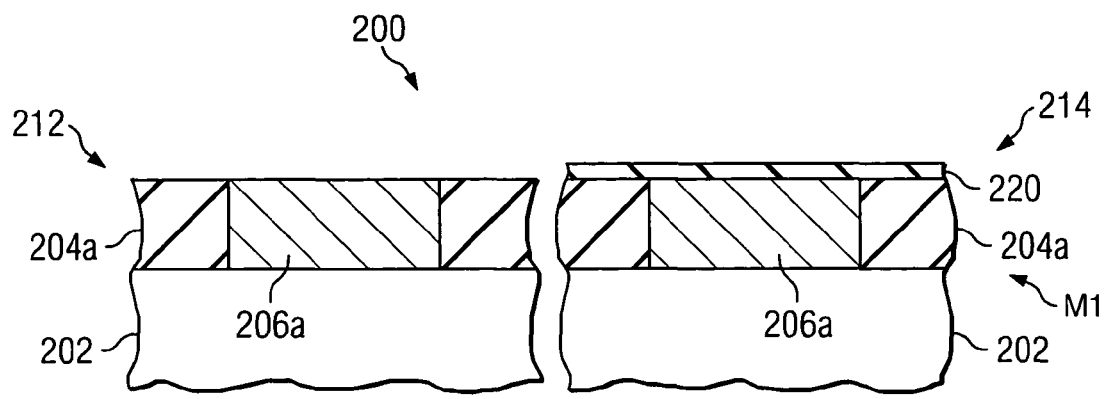
FIGS. 2 through 5 show cross-sectional views of a method of manufacturing a capacitor of a semiconductor device at various stages of manufacturing in accordance with an embodiment of the present invention.

Referring to FIG. 2, first, a workpiece 202 is provided. The workpiece 202 may include a semiconductor substrate comprising silicon or other semiconductor materials covered by an insulating layer, for example. The workpiece 202 preferably include active areas comprising electrical components and/or circuits formed over and/or within the workpiece 202, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may also comprise a silicon-on-insulator (SOI) substrate.

The workpiece 202 includes at least one first region 212 and at least one second region 214. Only one first region 212 and one second region 214 are shown in the figures; however, there may be a plurality of first regions 212 and second regions 214 on a single semiconductor device 200, for example. For the purposes of this discussion, the at least one first region 212 and the at least one second region 214 will be referred to as a first region 212 and second region 214 herein.

The first region 212 of the workpiece 202 preferably comprises a region over which the plurality of metallization layers that will be formed in subsequent manufacturing steps comprise interconnects of the semiconductor device 200. The second region 214 comprises a region over which the novel capacitors of the present invention will be formed within the metallization layers.

In one embodiment, the second region 214 preferably comprises a region wherein interconnects are not electrically needed in the design of the device 200. For example, second region 214 may comprise a region where no conductive lines will be formed in the metallization layers. Alternatively, the second region 214 may comprise a region wherein dummy conductive lines and/or vias, or fill structures, are a consideration, to improve planarity. In another embodiment, the second region 214 may comprise a region designated in the design for the formation of the novel capacitors to be described herein.

Next, metallization layers M1, V1, and M2 are formed over the workpiece 202. In this embodiment, each of the metallization layers M1, V1, and M2 may be formed using a subtractive etch process by depositing a conductive material over the workpiece 202, patterning and etching the conductive material to form conductive features 206a, 208a, and 206b, respectively, and depositing an insulating layer 204a, 204b, and 204c between the conductive features 206a, 208a, and 206b, respectively. Alternatively, the metallization layers M1, V1, and M2 may be formed using single damascene processes.

The insulating layers 204a, 204b, and 204c preferably comprise a dielectric material. For example, the insulating layers 204a, 204b, and 204c may comprise a low dielectric constant (k) material, having a dielectric constant of about 3.5 or lower, in one embodiment. Alternatively, the insulating layers 204a, 204b, and 204c may comprise a dielectric constant of about 3.5 or greater, in another embodiment, for example. The insulating layers 204a, 204b, and 204c may comprise $SiO_2$, SiON, or fluorinated silicon glass (FSG), as examples, although the insulating layers 204a, 204b, and 204c may alternatively comprise other materials and combinations thereof. The insulating layers 204a, 204b, and 204c may comprise a thickness of about 5,000 Angstroms or less, and in one embodiment, preferably comprise a thickness of about 2,000 to about 4,000 Angstroms, for example, although the insulating layers 204a, 204b, and 204c may alternatively comprise other thicknesses. The insulating layers 204a, 204b, and 204c may be deposited by chemical vapor deposition (CVD), by a spin-on process, as examples, although alternatively, the insulating layers 204a, 204b, and 204c may be formed using other methods.

Figure 5:
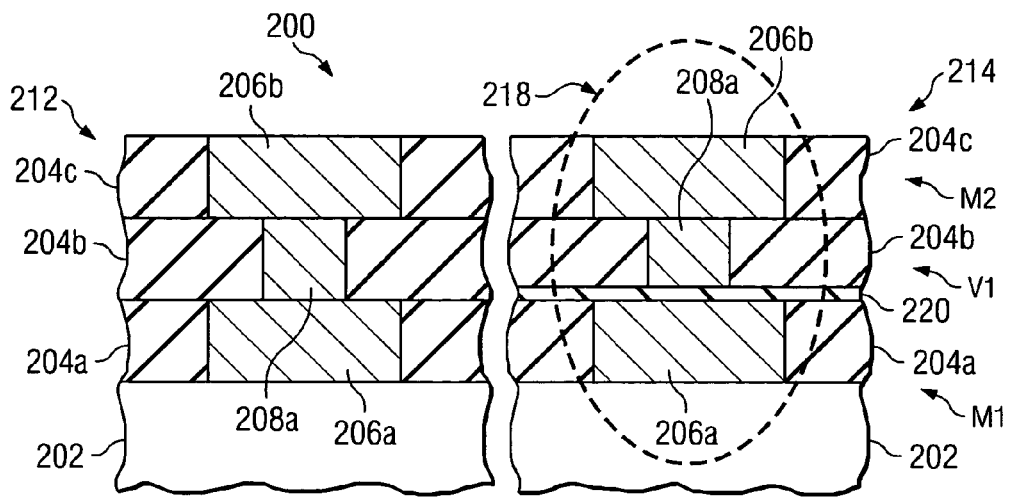
Figure 6:
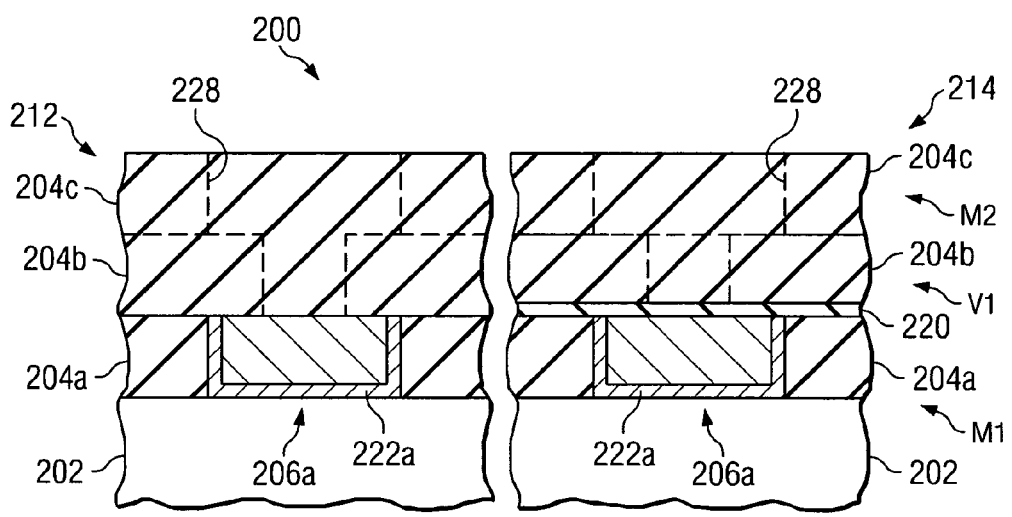
FIGS. 6 and 7 show cross-sectional views of a method of manufacturing a capacitor of a semiconductor device in accordance with another embodiment of the present invention.
Figure 7:
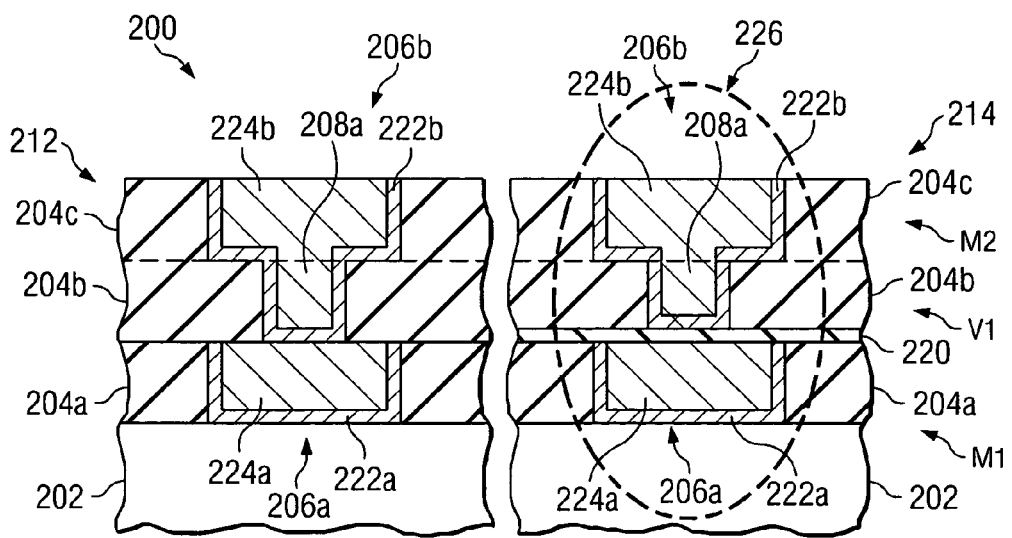

The conductive features 206a, 208a, and 206b preferably comprise a metal, and may include a conductive liner to improve adhesion and function as a diffusion barrier, as examples (the liners are not shown in FIGS. 2 through 5; see FIGS. 6 and 7 at 222a and 222b). The conductive features 206a, 208a, and 206b preferably comprise copper, a copper alloy, aluminum, an aluminum alloy, tungsten, a tungsten alloy, or combinations thereof, as examples, although alternatively, the conductive features 206a, 208a, and 206b may comprise other materials.

The conductive features 206a and 206b in the first region 212 preferably comprise conductive lines formed within conductive line layers M1 and M2. The conductive features 208a in the first region 212 preferably comprise vias formed within via layer V1. The conductive feature 206a in the second region 214 preferably comprises a bottom plate of a capacitor 218 (see FIG. 5), formed in the conductive line layer M1. The conductive features 208a and 206b in the second region 214 preferably comprise a top plate of the capacitor 218, formed in the via layer V1 and the conductive line layer M2.

If a damascene process is used to form the metallization layers M1, V1, and M2, first, insulating layer 204a is formed or deposited over a workpiece 202, as shown in FIG. 2. The insulating layer 204a is patterned using lithography with a desired pattern for conductive lines 204a in the first region 212 and for the bottom plate 206a in the second region 212. A conductive material is deposited over the patterned insulating layer 204a to fill the patterns. Any excess conductive material is removed from over the top surface of the insulating layer 204a, e.g., using a CMP process, as an example, although other methods may be used.

Next, a capacitor dielectric 220 is formed over the insulating material 204a and bottom plate 206a in the second region 214, as shown in FIG. 2. The capacitor dielectric 220 preferably comprises a thickness of about 10 nm or less, and more preferably comprises a thickness of about 5 nm or less in one embodiment, for example, although alternatively, the capacitor dielectric 220 may comprise other dimensions. The capacitor dielectric 220 may comprise a material typically used for capacitor dielectrics, such as an oxide or nitride, as examples. The capacitor dielectric 220 may comprise a high k dielectric material such as $AlO_x$, $HfO_x$, other dielectric materials, or combinations thereof, as examples. The capacitor dielectric 220 dimensions and materials selected are a function of the parameters of the particular device design, such as the required capacitance, applied voltage, and reliability, as examples.

The capacitor dielectric 220 may be deposited over both the first region 212 and the second region 214, and then removed from over the first region 212, for example. Alternatively, the first region 212 may be blocked while the capacitor dielectric 220 is deposited only over the second region 214, for example. In this embodiment, a hard mask or resist (not shown) may be deposited over the entire workpiece 202, and then removed from over the second region 214. The capacitor dielectric 220 is then deposited over the second region 214. The hard mask or resist, and any capacitor dielectric 220 material, if present, is then removed from the first region 212, leaving the structure shown in FIG. 2.

Figure 3:
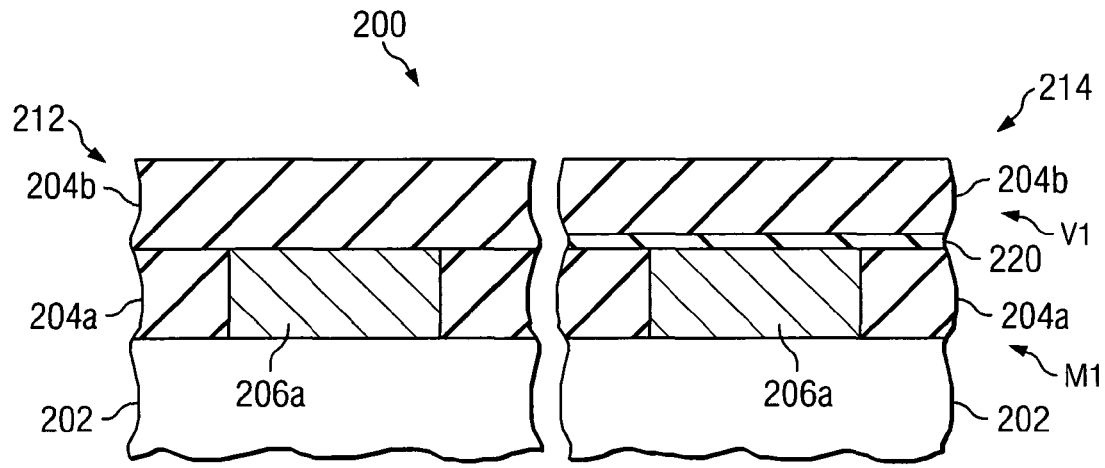
Figure 4:
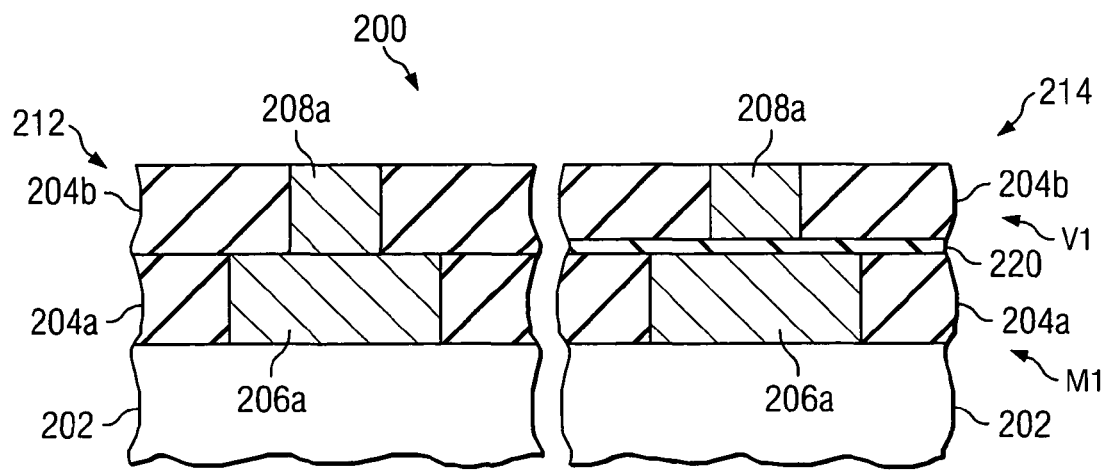

Next, an insulating layer 204b is deposited over the conductive lines 206a and insulating layer 204 in the first region 212 and over the capacitor dielectric 220 in the second region 214, as shown in FIG. 3. The insulating layer 204b may comprise a similar material and thickness as described with reference to insulating layer 204a, for example. The insulating layer 204b is patterned with a desired pattern for vias 206a in the first region 212 and for a portion of the top plate 208a in the second region 214, and the insulating layer 204b is filled with a conductive material to form the vias 206b in the first region 212 and portion 208a of the top plate of the capacitor, as shown. Again, excess conductive material is removed from the top surface of the insulating layer 204b, as described for insulating layer 204a, leaving the structure shown in FIG. 4.

Insulating layer 204c is deposited over insulating layer 204b, vias 208a and portion 208a of the top plate of the capacitor, as shown in FIG. 5. The insulating layer 204c is patterned with a desired pattern for conductive lines 206b in the first region 212 and portion 206b of the top plate in the second region 214. A conductive material is then deposited to fill the patterns, and excess conductive material is removed from the top surface of the insulating layer 204c, forming conductive lines 206b in the first region 212 and top portion 206b of the top plate of the capacitor 218 in the second region 214, as shown in FIG. 5.

Thus, a novel capacitor 218 is formed in the second region 214 over the workpiece 202, within metallization layers M1, V1, and M2, in accordance with an embodiment of the invention.

The shape of the capacitor plates 206a and 208a/206b may comprise a variety of shapes. For example, in one embodiment, the plates 206a and 208a/206b in the second region 214 preferably comprise similar or the same shapes as the conductive lines 206a and 206b and vias 208a in the first region 212. In another embodiment, the plates 206a and 208a/206b in the second region 214 preferably comprise the shape of fill patterns, such as the structures 106a, 106b, 106c, 108a, and 108b shown in prior art FIG. 1, as examples. Advantageously, the conductive lines 206a and 206b, vias 208a, and fill patterns may have been previously designed, so that designing the dimensions of the capacitor plates 206a and 208a/206b is not required: the only additional process steps are to form the capacitor dielectric 220, for example, and remove it from region 212 of the workpiece 202, for example.

FIGS. 6 and 7 show cross-sectional views of a method of manufacturing a capacitor of a semiconductor device in accordance with another embodiment of the present invention. The structure is similar to the structure shown in FIGS. 2 through 5, and the capacitor dielectric 220 is formed after forming the first metallization layer M1. However, in this embodiment, a dual damascene process is used to form the top plate 208a/206b of the capacitor 226. For example, after the capacitor dielectric 220 is formed in the second region 214 of the workpiece 202, insulating layer 204b/204c is formed over the first region 212 and second region 214 of the workpiece 202, as shown FIG. 6. The insulating layer 204b/204c may comprise two separate insulating layers 204b and 204c comprised of the same or different materials. Alternatively, the insulating layer 204b/204c may comprise a single insulating layer, having a greater thickness than insulating layer 204a, for example.

The insulating layer 204b/204c is patterned with two patterns; e.g., a first pattern for vias in via layer V1, and a second pattern for conductive lines in conductive line layer M2. The two patterns comprise a dual damascene pattern 228, shown in phantom in FIG. 6. Two lithography masks may be used to pattern the insulating layer 204b/204c, for example. A conductive material 224b is then deposited over the insulating layer 204b/204c to fill the patterns, and excess material is removed from the top surface of the insulating layer 204b/204c, as shown in FIG. 7.

In all of the embodiments described herein, an optional liner 222a and/or 222b may be formed before the conductive materials are deposited, as shown in FIGS. 6 and 7. The liners 222a and 222b are preferably relatively thin, to minimize the impact on the conductivity of the conductive features 206a, 208a, and 206b in both the first region 212 and second region 214, for example, and to minimize the impact on the capacitance of the capacitor 226 formed in the second region 214, for example. The liners 222a and 222b may comprise Ta, TaN, a copper seed layer, or multiple layers or combinations thereof, and preferably comprise a thickness of about 50 nm or less, as examples, although alternatively, the optional liners 222a and 222b may comprise other materials and thicknesses. After the liners 222a and/or 222b are formed over the patterned insulating layers 204a and 204b/204c, respectively, a conductive material 224a and 224b, respectively, is deposited, as shown.

Note that in FIGS. 2 through 5 and FIGS. 6 and 7, the bottom plate 206a of the capacitor 218 and 226 is formed in a conductive line layer M1. However, alternatively, the bottom plate 206a of the capacitor 218 and 226 may alternatively be formed in a via layer such as layer V1, for example (not shown in the figures).

Figure 8:
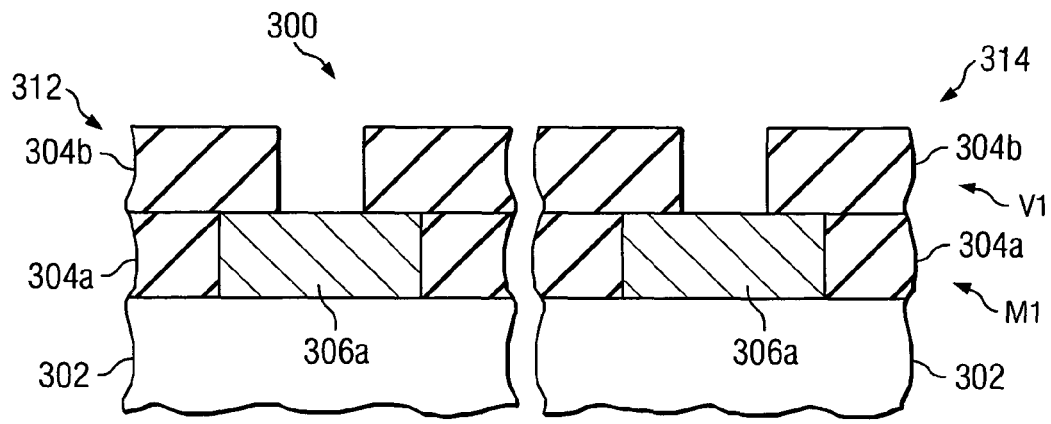
FIGS. 8 and 9 show cross-sectional views of a method of manufacturing a capacitor of a semiconductor device in accordance with yet another embodiment of the present invention.
Figure 9:
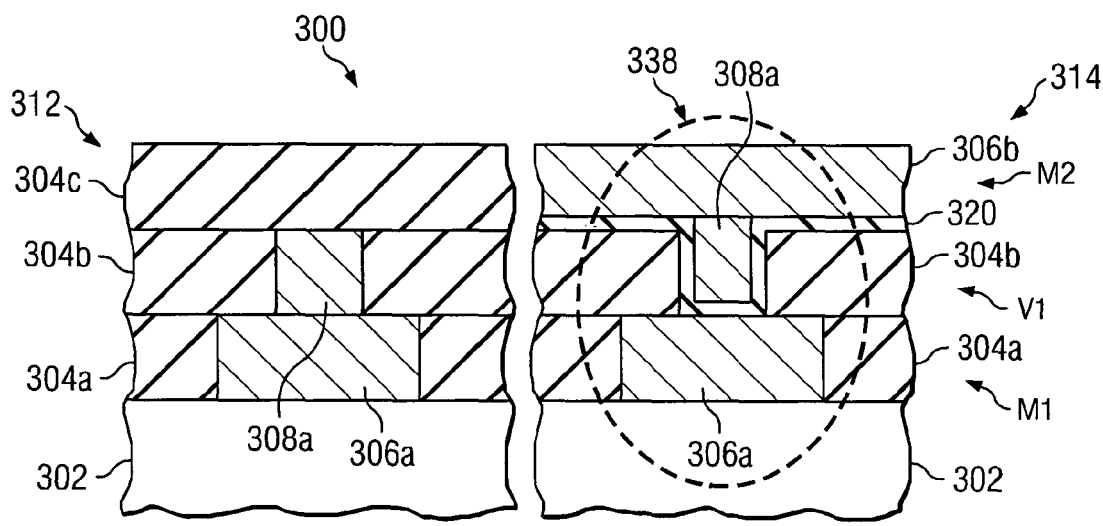

FIGS. 8 and 9; 10 and 11; 12 and 13; 14 and 15; and 16 show additional preferred embodiments of the present invention. Like numerals are used for the various elements that were described in FIGS. 2 through 5, and FIGS. 6 and 7. To avoid repetition, each reference number shown in FIGS. 8 and 9; 10 and 11; 12 and 13; 14 and 15; and 16 is not described again in detail herein. Rather, similar materials x02, x04, x06, x08, etc., are preferably used for the various material layers shown as were described for FIGS. 2 through 5, and FIGS. 6 and 7, where x=2 in FIGS. 2 through 5, and FIGS. 6 and 7, x=3 in FIGS. 8 through 11, x=4 in FIGS. 12 and 13, x=5 in FIGS. 14 and 15, and x=6 in FIG. 16. As an example, the preferred and alternative materials and dimensions described for the workpiece 202 in the description for FIGS. 2 through 5 are preferably also used for the workpiece 302 of FIGS. 8 through 11.

FIGS. 8 and 9 show cross-sectional views of a method of manufacturing a capacitor 338 of a semiconductor device in accordance with another embodiment of the present invention, wherein the capacitor dielectric 320 is formed in the second region 314 after insulating layer 304b has been deposited over the first metallization layer M1 and patterned. The first metallization layer M1 may be formed using a single damascene process or a subtractive etch process in this embodiment, as examples. The capacitor dielectric 320 conforms to the shape of the pattern, lining the trench of the pattern, in this embodiment. A conductive material is deposited over the patterned insulating layer 304b in the first region 312 and over the capacitor dielectric 320 in the second region 314, and excess portions of the conductive material are removed from the top surface of the insulating layer 304b in at least the first region 312, as shown in FIG. 9. The capacitor dielectric 320 may be removed from over the top surface of the insulating layer 304b in at least the first region 312 (not shown), or alternatively, the capacitor dielectric 320 may be left remaining on the top surface of the insulating layer 304b in at least the first region 312.

An insulating layer 304c is then deposited over the metallization layer V1, and the insulating layer 304c is patterned. A conductive material is deposited over the patterned insulating layer 304c to form conductive features 306b in the first region 312 and second region 314, as shown. FIG. 9 illustrates that the conductive lines 306b of metallization layer M2 may be formed substantially orthogonal to the conductive lines 306a of the lower metallization layer M1, for example.

Thus, in this embodiment, a capacitor 338 is formed in metallization layers M1, V1, and M2, as shown in FIG. 9. The capacitor 338 in the second region 314 comprises a bottom plate 306a and a top plate 308a/306b. The bottom portion 308a of the top plate is formed in a single damascene process, and the top portion 306b is formed in a single damascene process in this embodiment.

Figure 10:
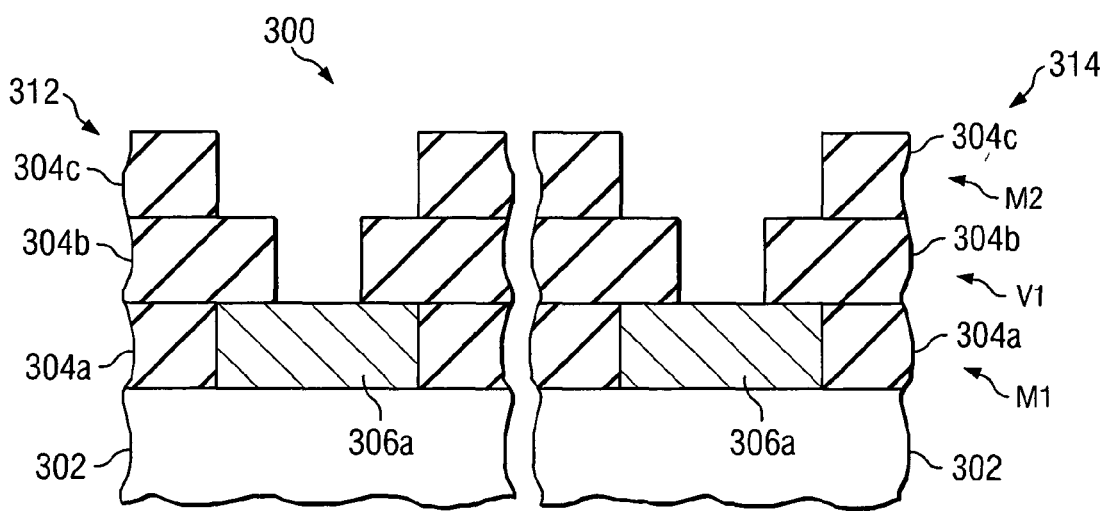
FIGS. 10 and 11 show cross-sectional views of a method of manufacturing a capacitor of a semiconductor device in accordance with another embodiment of the present invention.
Figure 11:
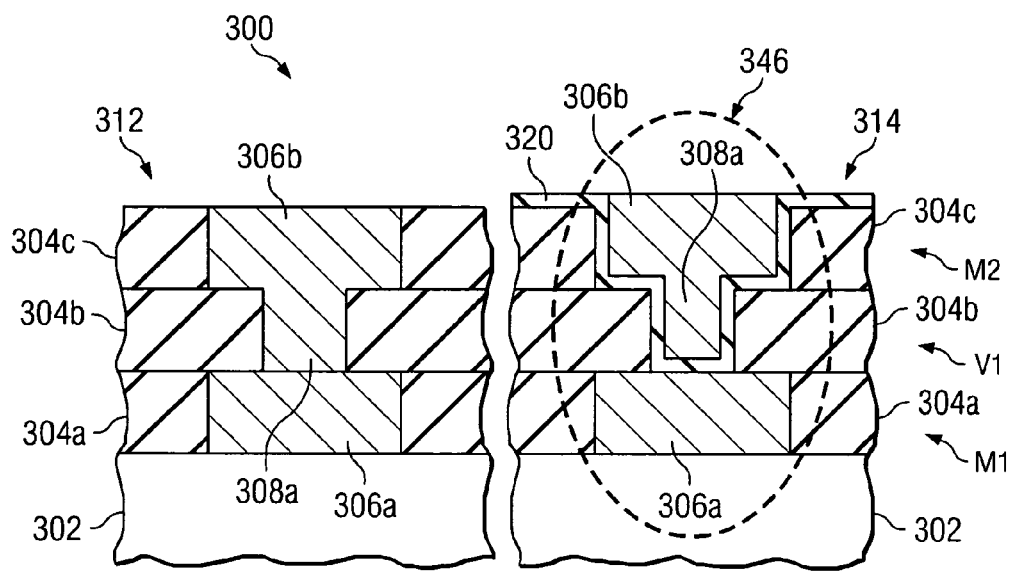

FIGS. 10 and 11 show another embodiment of the present invention, wherein the bottom portion 308a of the top plate of the capacitor 346 and the top portion 306b of the top plate of the capacitor 346 are formed in a dual damascene process, for example. The capacitor dielectric 320 in this embodiment lines the pattern in insulating layers 304b and 304c, and may either be left residing on the top surface of the insulating layer 304c, as shown in FIG. 11, or may be removed from the top surface of the insulating layer 304c (not shown).

Figure 12:
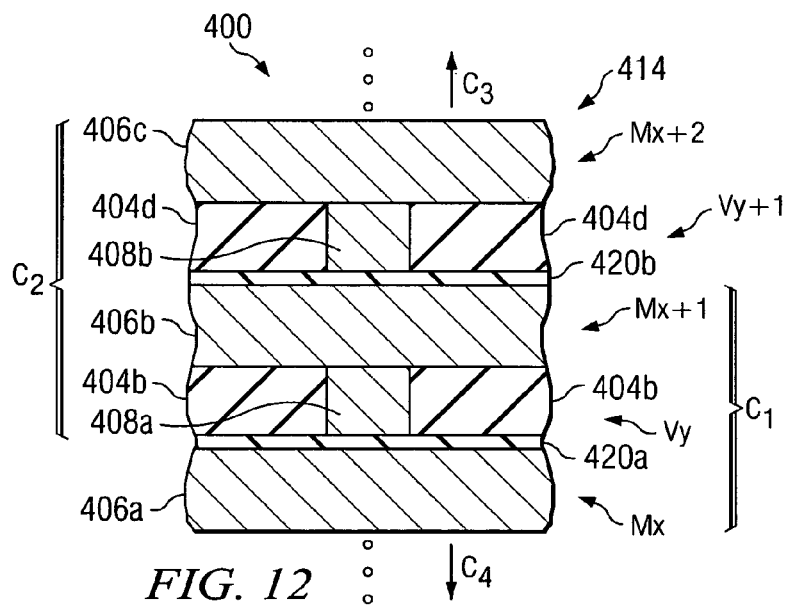
FIG. 12 illustrates a cross-sectional view of a plurality of capacitors of the present invention arranged in a stack.

FIG. 12 illustrates a cross-sectional view of a plurality of capacitors $C_1$ and $C_2$ of the present invention arranged in a stack. A plurality of stacks may be formed in the second region 414 within a plurality of or all of the metallization layers, $M_x, M_{x+1}, M_{x+2} \ldots M_{x+n}$ and $V_y, V_{y+1}, \ldots V_{x+n-1}$, for example. The embodiments described with reference to FIGS. 2 through 7 are illustrated; however, the embodiments described with reference to FIGS. 8 through 11 may also be arranged in a stack or plurality of stacks (not shown).

Capacitor $C_1$ comprises a bottom plate 406a, a capacitor dielectric 420a, and a top plate 408a/406b formed in insulating layer 404b. Capacitor $C_2$ comprises a bottom plate 408a/406b, a capacitor dielectric 420b, and a top plate 408b/406c formed in insulating layer 404d. In this embodiment, adjacent capacitors $C_1$ and $C_2$ may share a plate, such as plate 408a/406b, as an example. Other capacitors $C_3$ and $C_4$ may be formed in a similar fashion on either side of capacitors $C_2$ and $C_1$, respectively, as shown.

Figure 13:
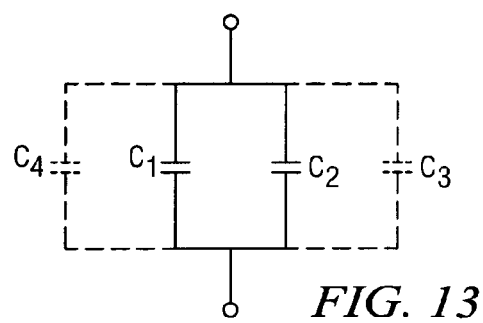
FIG. 13 illustrates a schematic of a plurality of stacked capacitors shown in FIG. 12 of the present invention connected in parallel.

The stack of capacitors may be coupled together electrically, as shown in the schematic of FIG. 13, for example. This is advantageous in particular if the size of the plates 406a, 408a, 406b, 408b, and 406c are substantially the same as the size of the conductive features formed in the metallization layers in the first region (not shown in FIG. 12; see FIGS. 2 through 5 at 212). If the plates 406a, 408a, 406b, 408b, and 406c are small, the capacitance of the capacitor formed in the second region 414 will be relatively small. Capacitors connected in parallel increase the capacitance: for example, the capacitance of the structure shown in FIG. 12 when connected in parallel would equal the sum of the capacitance of capacitors $C_1, C_2, C_3$, and $C_4$.

Figure 14:
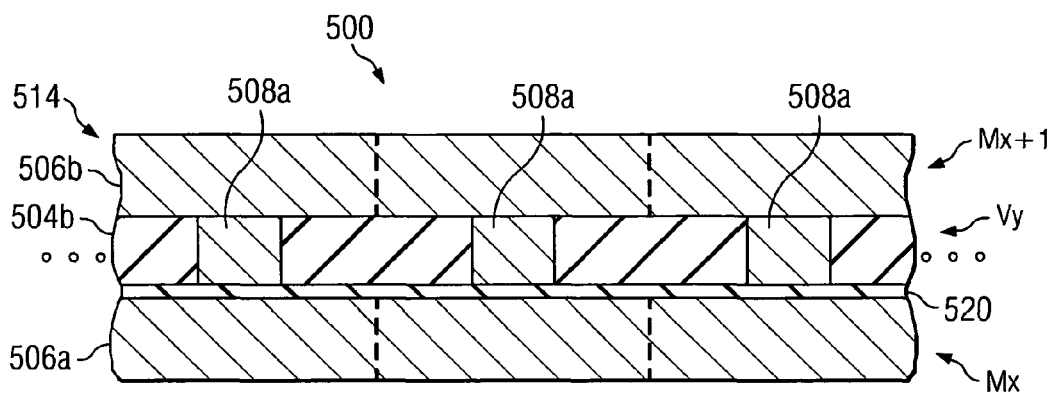
FIG. 14 illustrates a cross-sectional view of a plurality of capacitors of the present invention arranged in an array.
Figure 15:
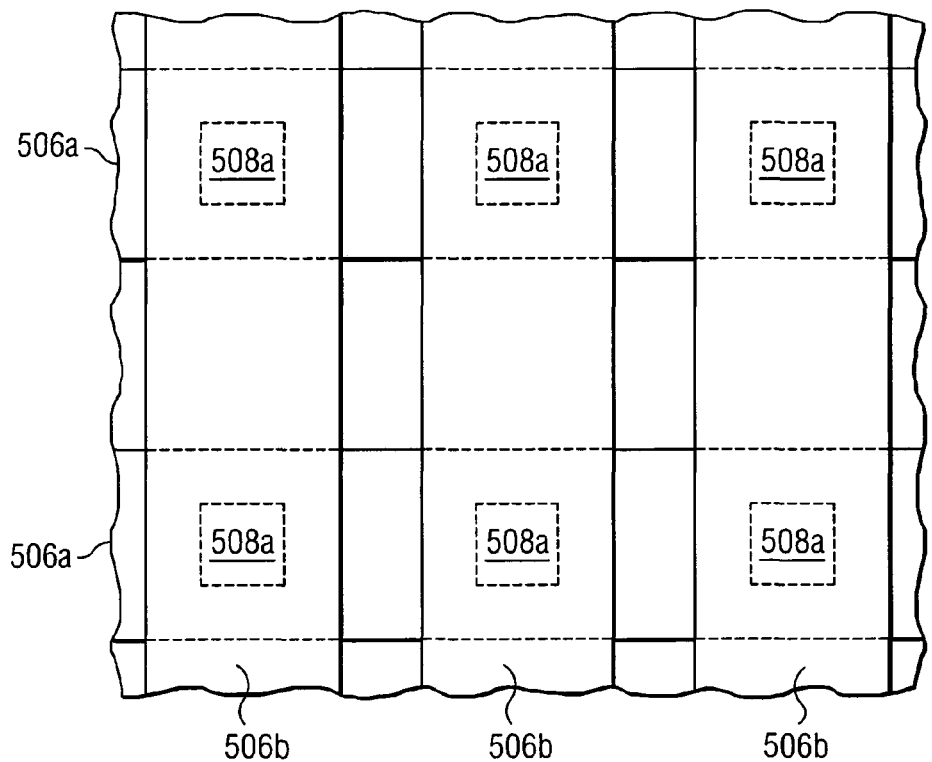
FIG. 15 is a top view of the array of capacitors shown in FIG. 14.

FIGS. 14 and 15 illustrate a cross-sectional view and a top view of a plurality of the novel capacitors of the present invention arranged in an array. Again, the embodiments described with reference to FIGS. 2 through 7 are illustrated; however, the embodiments described with referent to FIGS. 8 through 11 may also be arranged in an array in the second region 514.

The array of capacitors shown in FIG. 14 comprise a bottom plate 506a formed in metallization layer $M_x$, a capacitor dielectric 520, and a top plate 508a/506b formed within insulating layer 504b in metallization layer $V_y$ and in metallization layer $M_{x+1}$, for example. The array of capacitors may be accessed using addressing, e.g., by forming conductive lines at substantially orthogonal position to one another in adjacent layers, similar to the addressing used for memory devices, using wordlines, bitlines, sensing circuits, and logic circuits, for example (not shown).

In this embodiment, advantageously, the conductive lines in the second region 514, shown in a top view at 506a and 506b in FIG. 15, may be slightly oversized, to provide a fringing cap for the array of capacitors, for example.

Figure 16:
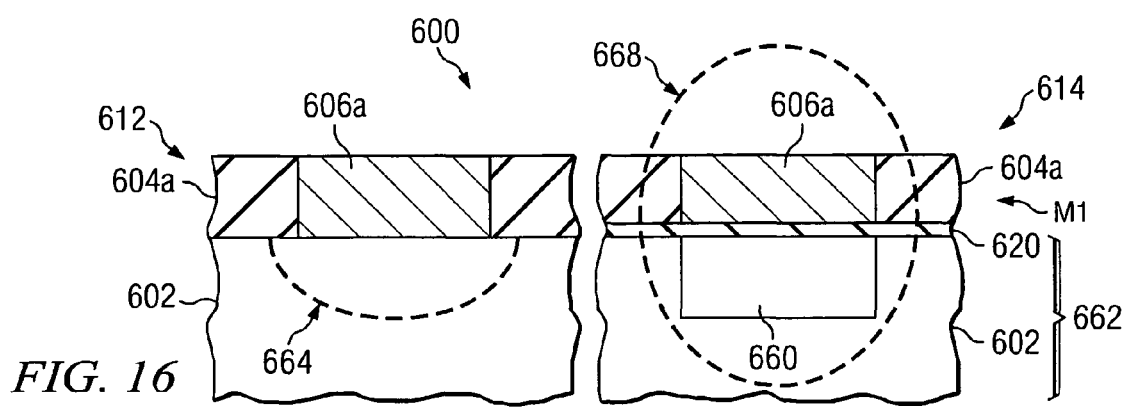
FIG. 16 shows a cross-sectional view of an embodiment of the present invention, wherein the bottom plate of the capacitor comprises a layer manufactured in the FEOL, and the top plate is part of a metallization layer formed in the BEOL.

FIG. 16 shows a cross-sectional view of an embodiment of the present invention, wherein the bottom plate 660 of a capacitor 668 comprises a layer manufactured in the FEOL (e.g., portion 662 of the semiconductor device 600), and the top plate 606a is part of a metallization layer M1 formed in the BEOL. In this embodiment, the bottom plate 660 comprises a conductive material, e.g., such as a semiconductive material or a silicided material, as examples, formed in a top surface of the workpiece 602 in region 614. The capacitor dielectric 620 is formed over region 614 of the workpiece, but not over region 612 wherein interconnects of the semiconductor device 600 will be formed. A metallization layer M1 is then formed over the workpiece 602 in region 612 and over the capacitor dielectric 620 in region 614. The capacitor 668 comprises the bottom plate 660, the capacitor dielectric 620 and the top plate 606a in the metallization layer M1.

Note that in this embodiment, wherein only one plate of the capacitor 668 is formed in a metallization layer M1, as in the other embodiments described herein, the capacitor dielectric 620 may also be formed over a patterned single damascene structure, as shown in FIGS. 8 and 9, or over a patterned dual damascene structure, as shown in FIGS. 10 and 11. Furthermore, a plurality of capacitors may be stacked and/or coupled in parallel, as shown in FIGS. 12 and 13, and/or arranged in an array, as shown in FIGS. 14 and 15.

In the embodiments described herein, the capacitors 218, 226, 338, 346, $C_1$, and $C_2$ may be coupled to the interconnects, e.g., conductive lines 206a, 206b, 306a, 306b, 606a and/or vias 208a, 308b in the first region 212, 312, and 612 to the active areas (such as active area 664 of workpiece 602 shown in FIG. 16) of the workpiece 202, 302, 402, 502, and 602, or both. Alternatively, the capacitors 218, 226, 338, 346, $C_1$, and $C_2$ may not be coupled to the interconnects, e.g., conductive lines and/or vias in the first region 212 and 312, to the active areas of the workpiece 202 and 302, or both.

Embodiments of the present invention also include methods of designing a semiconductor device. A preferred method includes designing an integrated circuit, the integrated circuit design comprising at least one active area. A layout is determined for a plurality of metallization layers over the at least one active area, the layout for the plurality of metallization layers including at least one first region and at least one second region, the at least one first region comprising a region wherein the plurality of metallization layers comprise interconnects of the semiconductor device, the at least one second region comprising a region with no interconnects disposed therein. A layout is then designed for at least one novel capacitor in the plurality of metallization layers in the at least one second region. The at least one capacitor may be coupled to an interconnect in the at least one first region, to the at least one active area, or both.

In one embodiment, the integrated circuit may be fabricating and tested, and after testing the semiconductor device, the at least one capacitor may be coupled in the at least one second region to an interconnect in the at least one first region, to the at least one active area, or both. The capacitor may be hand-wired for example, to electrically connect it to other portions of the integrated circuit. In another embodiment, a lithography mask for one of the plurality of metallization layers may be changed, in order to connect a conductive line or via of the plurality of metallization layers to the at least one capacitor.

Advantages of embodiments of the present invention include providing improved methods of utilizing space in semiconductor devices 200, 300, 400, 500, and 600 by fabricating capacitors 218, 226, 338, 346, $C_1$, $C_2$, and 668 in electrically unused areas of metallization layers. A plurality of the capacitors $C_1$ and $C_2$ (FIG. 12) may be stacked and electrically coupled together in parallel (FIG. 13) to provide increased capacitance. A plurality of the capacitors may be arranged in an array (FIG. 14) and may be accessed using addressing. The capacitors 218, 226, 338, 346, $C_1$, $C_2$, and 668 may be electrically connected to functional regions of the semiconductor device 200, 300, 400, 500, and 600 or may be used as spare capacitors, providing redundancy in the integrated circuit.

Figure 1:
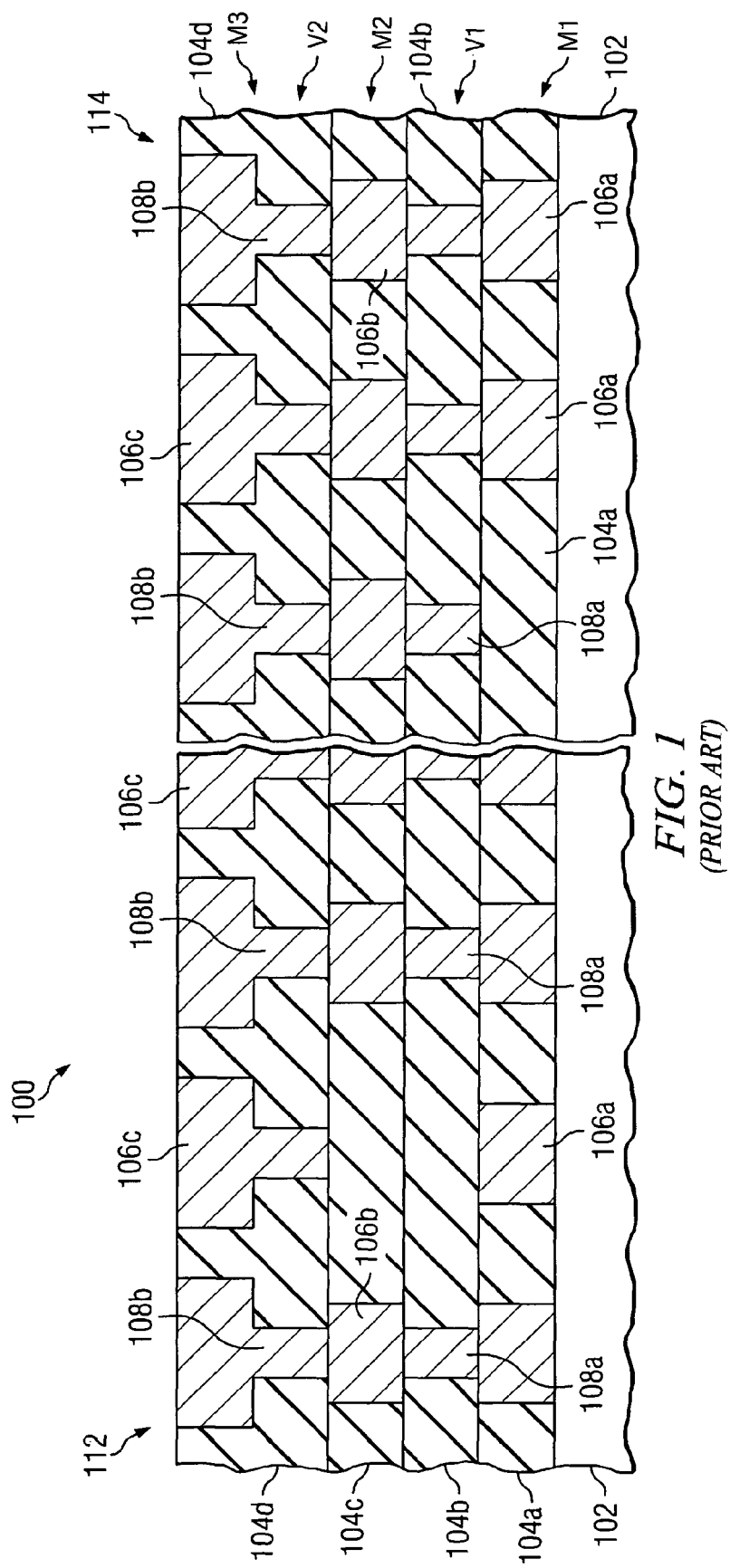
FIG. 1 is a cross-sectional view of a prior art semiconductor device having electrically active conductive features formed in one region and electrically inactive conductive features formed in another region.

Because the capacitors 218, 226, 338, 346, $C_1$, $C_2$, and 668 comprise plates 206a, 208a/206b, 306a, 308a/306b, 406a, 408a/406b, 408b/406c, 506a, 508a/506b, and 606a in the second regions 214, 314, 414, 514, and 614 that have substantially the same dimensions as interconnect features 206a, 208a/206b, 306a, 308a/306b, 406a, 408a/406a, 408b/406c, 506a, 508a/506b, and 606a in the first regions 212, 312, and 612 and/or fill structures (such as dummy conductive features 106a, 108a, 106b, 108b and 106c in prior art FIG. 1), the capacitors 218, 226, 338, 346, $C_1$, $C_2$, and 668 are easily integratable into existing semiconductor device structures and manufacturing process flows. The novel capacitors 218, 226, 338, 346, $C_1$, $C_2$, and 668 are small, fast, and low in complexity and cost. The capacitors 218, 226, 338, 346, $C_1$, $C_2$, and 668 may be tuned by adjusting the capacitor dielectric 220, 320, 420a, 420b, 520, and 620 thickness and materials, and by array arrangement, as examples.

The novel capacitors 218, 226, 338, 346, $C_1$, $C_2$, and 668 can function as spare capacitors in an integrated circuit design, providing redundancy in the design, and providing the ability to switch on or off the capacitors, to tune the capacitance of active devices of the integrated circuit. The capacitors 218, 226, 338, 346, $C_1$, $C_2$, and 668 provided improved process windows and increased accuracy in capacitive elements of integrated circuit designs.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:

forming at least one active area in or over a workpiece, the workpiece comprising at least one first region and at least one second region; and forming a first metallization layer and a second metallization layer over the workpiece, thereby forming lower level and upper level interconnects of the semiconductor device and forming at least one capacitor, the at least one first region of the workpiece comprising a region wherein the first and the second metallization layers comprise the lower and the upper level interconnects of the semiconductor device respectively, the at least one second region comprising a region wherein the first and the second metallization layers comprise the at least one capacitor, wherein forming the at least one capacitor over the workpiece comprises:
  forming a first plate of the at least one capacitor over the workpiece in the first metallization layer, wherein the first plate and the lower level interconnects are formed simultaneously,
  forming a capacitor dielectric over the first plate, and
  forming a second plate in the second metallization layer over the capacitor dielectric, wherein the second plate and the upper level interconnects are formed.

2. The method according to claim 1, wherein the second plate of the at least one capacitor in the at least one second region comprises substantially the same dimensions as the upper level interconnects of the semiconductor device in the at least one first region, or substantially the same dimensions as a fill structure for the second metallization layer.

3. The method according to claim 1, wherein the at least one capacitor is coupled to the lower and upper level interconnects in the at least one first region of the workpiece, to the at least one active area, or to both.

4. A method of manufacturing a semiconductor device, the method comprising:
  providing a workpiece comprising transistors, the workpiece comprising at least one first region and at least one second region;
  forming at least one active area in or over the workpiece; and
  forming at least one metallization layer over the workpiece,
  wherein the at least one first region of the workpiece comprises a region wherein the at least one metallization layer comprises interconnects of the semiconductor device,
  wherein the at least one second region comprises a region wherein the at least one metallization layer comprises at least one capacitor,
  wherein forming the at least one metallization layer comprises forming at least one plate of the at least one capacitor from a portion of the at least one metallization layer, and
  wherein forming the at least one metallization layer comprises forming a plurality of metallization layers over the workpiece, wherein each metallization layer of the plurality of metallization layers comprises a conductive line layer, wherein the plurality of metallization layers comprise a first metallization layer and at least one second metallization layer, wherein the at least one capacitor comprises a first plate comprised of a portion of the first metallization layer, a second plate comprised of a portion of the at least one second metallization layer, and a capacitor dielectric disposed between the first plate and the second plate.

5. The method according to claim 4, wherein forming the plurality of metallization layers comprises:
  forming the first metallization layer over the at least one active area and the workpiece in the at least one first region and the at least one second region, the first metallization layer being disposed within a first insulating layer;
  forming the capacitor dielectric over the first metallization layer and the first insulating layer in the at least one second region; and
  forming the at least one second metallization layer over the first metallization layer in the at least one first region and over the capacitor dielectric in the at least one second region.

6. The method according to claim 4, wherein forming the first metallization layer comprises forming a first conductive line layer, and wherein forming the at least one second metallization layer comprises forming a first via layer and forming a second conductive line layer over the first via layer.

7. The method according to claim 4, wherein forming the first metallization layer and forming the at least one second metallization layer comprise a single damascene process, a dual damascene process, or a subtractive etch process.

8. The method according to claim 4, wherein forming the plurality of metallization layers comprises a damascene process.

9. The method according to claim 8, wherein forming the plurality of metallization layers comprises depositing an insulating layer, patterning the insulating layer, forming a liner over the patterned insulating layer, depositing a conductive material over the liner, and removing the conductive material from over a top surface of the insulating layer.

10. The method according to claim 9, wherein depositing the liner comprises depositing about 50 nm or less of Ta, TaN, a copper seed layer, or multiple layers or combinations thereof.

11. The method according to claim 9, wherein depositing the conductive material comprises depositing copper, a copper alloy, aluminum, an aluminum alloy, tungsten, a tungsten alloy, or combinations thereof.

12. The method according to claim 4, wherein forming the plurality of metallization layers comprises:
  forming the first metallization layer over the at least one active area and the workpiece in the at least one first region and the at least one second region, the first metallization layer being disposed within a first insulating layer;
  forming a second insulating layer over the first metallization layer and the first insulating layer in the at least one first region and the at least one second region;
  patterning the second insulating layer;
  forming the capacitor dielectric over the second insulating layer in the at least one second region;
  depositing a first conductive material over the second insulating layer in the at least one first region and over the capacitor dielectric in the at least one second region;
  removing excess first conductive material from over a top surface of the second insulating layer;
  forming a third insulating layer over the second insulating layer and the first conductive material in the at least one first region and in the at least one second region;
  patterning the third insulating layer;
  depositing a second conductive material over the third insulating layer in the at least one first region and in the at least one second region; and
  removing excess second conductive material from over a top surface of the third insulating layer, wherein the second insulating layer and the first conductive material comprise a via layer in the at least one first region, wherein the third insulating layer and the second conductive material comprise a conductive line layer in the at least one first region, and wherein the first conductive material and the second conductive material in the at least one second region comprise the second plate of the at least one capacitor.

13. The method according to claim 4, wherein forming the plurality of metallization layers comprises:
  forming the first metallization layer over the at least one active area and the workpiece in the at least one first region and the at least one second region, the first metallization layer being disposed within a first insulating layer;

forming at least one second insulating layer over the first metallization layer and the first insulating layer in the at least one first region and the at least one second region;

patterning the at least one second insulating layer;

forming the capacitor dielectric over the at least one second insulating layer in the at least one second region;

depositing a conductive material over the at least one second insulating layer in the at least one first region and over the capacitor dielectric in the at least one second region; and removing excess conductive material from over a top surface of the at least one second insulating layer, wherein the at least one second insulating layer and the conductive material comprise a via layer or a via layer and a conductive line layer in the at least one first region, and wherein the conductive material in the at least one second region comprises the second plate of the at least one capacitor.

14. The method according to claim 4, wherein the first plate and the second plate of the at least one capacitor are formed in a conductive line layer of the plurality of metallization layers, in a via layer of the plurality of metallization layers, or in both.

15. A method of manufacturing a semiconductor device, the method comprising:

providing a workpiece, the workpiece comprising at least one first region and at least one second region;

forming at least one active area in or over the workpiece; and forming at least one metallization layer over the workpiece, wherein the at least one first region of the workpiece comprises a region wherein the at least one metallization layer comprises interconnects of the semiconductor device, wherein the at least one second region comprises a region wherein the at least one metallization layer comprises at least one capacitor, wherein forming the at least one metallization layer comprises forming at least one plate of the at least one capacitor from a portion of the at least one metallization layer, wherein forming the at least one metallization layer comprises forming a plurality of metallization layers over the workpiece, wherein each metallization layer of the plurality of metallization layers comprises a conductive line layer, wherein the plurality of metallization layers comprise a first metallization layer and at least one second metallization layer, wherein the at least one capacitor comprises a first plate comprised of a portion of the first metallization layer, a second plate comprised of a portion of the at least one second metallization layer, and a capacitor dielectric disposed between the first plate and the second plate, wherein forming the plurality of metallization layers comprises forming a plurality of horizontal metallization layers, wherein the at least one capacitor comprises a plurality of capacitors, and wherein at least two of the plurality of capacitors are stacked in adjacent horizontal metallization layers.

16. The method according to claim 15, wherein forming the plurality of metallization layers further comprises coupling at least two of the stacked capacitors in parallel.

17. A method of manufacturing a semiconductor device, the method comprising:

providing a workpiece, the workpiece comprising at least one first region and at least one second region, the workpiece comprising transistors;

forming at least one active area in the workpiece; and forming a first metallization layer over the workpiece, the at least one first region of the workpiece comprising a region wherein the first metallization layer comprises interconnects of the semiconductor device, the at least one second region comprising a region wherein the first metallization layer comprises a first plate of at least one capacitor, wherein forming the first metallization layer comprises forming the first plate of the at least one capacitor from a portion of the first metallization layer, wherein the at least one capacitor comprises a plurality of capacitors, and wherein the plurality of capacitors is arranged in an array.

18. The method according to claim 17, wherein either a second plate, the first plate, or both, of the plurality of capacitors includes a fringing cap.

19. The method according to claim 17, wherein the first plate and a second plate of the plurality of capacitors are formed in a conductive line layer of the plurality of metallization layers, in a via layer of the plurality of metallization layers, or in both.

20. The method according to claim 17, further comprising forming a second metallization layer over the workpiece, wherein forming the second metallization layer comprises forming a second plate of the at least one capacitor from a first portion of the second metallization layer and interconnects of the semiconductor device from a second portion of the second metallization layer.

* * * * *